(12) United States Patent
Buettner et al.

(10) Patent No.: US 12,203,983 B2
(45) Date of Patent: Jan. 21, 2025

(54) CONTACTING MODULE FOR CONTACTING OPTOELECTRONIC CHIPS

(71) Applicant: JENOPTIK Optical Systems GmbH, Jena (DE)

(72) Inventors: Robert Buettner, Jena (DE); Armin Grundmann, Jena (DE); Tobias Gnausch, Jena (DE); Thomas Kaden, Dresden (DE); Stefan Franz, Jena (DE); Christian Karras, Jena (DE)

(73) Assignee: JENOPTIK Optical Systems GmbH, Jena (DE)

( * ) Notice: Subject to any disclaimer, the term of this patent is extended or adjusted under 35 U.S.C. 154(b) by 206 days.

(21) Appl. No.: 18/041,594

(22) PCT Filed: Jan. 27, 2021

(86) PCT No.: PCT/DE2021/100079
§ 371 (c)(1),
(2) Date: Feb. 14, 2023

(87) PCT Pub. No.: WO2022/033618
PCT Pub. Date: Feb. 17, 2022

(65) Prior Publication Data
US 2023/0296668 A1 Sep. 21, 2023

(30) Foreign Application Priority Data
Aug. 14, 2020 (DE) .................... 10 2020 005 065.4

(51) Int. Cl.
*G01R 31/311* (2006.01)
*G01R 1/07* (2006.01)
*G01R 31/28* (2006.01)

(52) U.S. Cl.
CPC ............ *G01R 31/311* (2013.01); *G01R 1/071* (2013.01); *G01R 31/2887* (2013.01)

(58) Field of Classification Search
CPC .. G01R 31/311; G01R 1/071; G01R 31/2887; G01R 1/07; G01R 1/073
See application file for complete search history.

(56) References Cited

U.S. PATENT DOCUMENTS 5,631,571 A 5/1997 Spaziani et al.
6,515,494 B1 2/2003 Low
(Continued)

FOREIGN PATENT DOCUMENTS

CN 111123072 A 5/2020
DE 10 2012 008 144 A1 10/2013
WO WO 2019/029765 A1 2/2019

*Primary Examiner* — Alvaro E Fortich
(74) *Attorney, Agent, or Firm* — Christensen, Fonder, Dardi & Herbert PLLC

(57) ABSTRACT

A contacting module and a method for assembling a contacting module with an optical module, containing an optical block made of glass, and with an electronics module, the optical block being connected via an adhesive connection to the electronics module or the optical module having a mounting plate, which is mounted on the electronics module so as to be repeatedly releasable therefrom and is connected to the optical block via an adhesive connection. The adhesive connection is produced via at least three cylinder pins, which each have a first end face bearing against the optical block by an adhesive and are glued in through-bores in the carrier plate or the mounting plate.

7 Claims, 4 Drawing Sheets

(56) References Cited

U.S. PATENT DOCUMENTS

| | | |
|---|---|---|
| 11,480,495 B2 | 10/2022 | Gnausch et al. |
| 2001/0028254 A1 | 10/2001 | Buks et al. |
| 2005/0179427 A1 | 8/2005 | Nordgren et al. |
| 2006/0109015 A1 | 5/2006 | Thacker et al. |
| 2012/0033208 A1 | 2/2012 | Hara et al. |
| 2014/0363153 A1* | 12/2014 | McShane ............... H01L 22/12 398/9 |
| 2017/0082799 A1* | 3/2017 | Novack ................ G01R 31/308 |
| 2017/0199327 A1* | 7/2017 | Djordjevic ............. G02B 6/122 |
| 2017/0307687 A1* | 10/2017 | Grosse .................... G02B 6/34 |
| 2017/0315299 A1 | 11/2017 | Mathai et al. |
| 2020/0027798 A1* | 1/2020 | Lin ........................ G02B 1/11 |

* cited by examiner

CONTACTING MODULE FOR CONTACTING OPTOELECTRONIC CHIPS

PRIORITY CLAIM

The present application is a National Phase entry of PCT Application No. PCT/DE2021/100079, filed Jan. 27, 2021, which claims priority from German Patent Application No. 10 2020 005 065.4, filed Aug. 14, 2020, the disclosures of which are hereby incorporated by reference herein in their entirety.

FIELD OF THE INVENTION

The invention relates to a contacting module for testing optoelectronic chips.

BACKGROUND OF THE INVENTION

The invention pertains to the field of testing and qualifying chips with opto-electrically integrated circuits, known as PICs (photonic integrated circuits), at wafer level. In contrast to conventional chips with purely electrically integrated circuits, so-called ICs (integrated circuits), PICs integrate optical functionalities as well as electric circuits.

In the manufacture of ICs, e.g. using CMOS technology, tests and measurements are carried out in various manufacturing steps in order to monitor the process on the one hand and to carry out quality control on the other. An established test is the electrical wafer level test after completion of the wafer. Here, functional and non-functional chips (known good dies) are identified and recorded in a wafer map, thereby determining the yield. When separating the wafer into individual chips, the non-functional chips are rejected. The test apparatus required for the wafer level test is available in the form of wafer probers and wafer testers with associated contacting modules (probe cards). The contacting module connects the interfaces (inputs and outputs) on the device side of the wafer tester with the individual interfaces (inputs and outputs) of the chips of the wafer fixed on the wafer prober. Typically, the contacting module is configured in such a way that it contacts only one chip, but it may also be configured to contact several chips at the same time. It is also not absolutely necessary that the chips for contacting are still present within the wafer composite. In order to contact several chips of a wafer simultaneously or one after the other, the chips merely need to have a fixed and defined position relative to each other. This margin is given for prior art contacting modules as well as for a contacting module according to the invention.

Test apparatuses for testing purely electronic chips (semiconductor chips with ICs) have been optimized and diversified over decades in order to be able to qualify high volumes of the most diverse ICs with high throughput for cost optimization.

PICs are usually manufactured using the same established semiconductor processes, e.g. CMOS technology. Initially, as a result of the very small production volumes of PICs compared to IC manufacture, only tests for process characterization, but no functional tests of the PICs, were usually carried out in a semiconductor factory. Functional characterization was the end customer's responsibility and was often performed on sawn chips. For the test apparatus used, independent, separate electrical and optical contacting modules were used.

Testing PICs at the wafer level requires the coupling and uncoupling of light from the PIC level, usually by means of integrated grating couplers as coupling points. Grating couplers can be functional components in the chip or sacrificial structures on the wafer, e.g. in the scribe lane or on adjacent chips.

The aforementioned US 2006/0109015 A1 discloses an optoelectronic contacting module (probe module) for testing chips with electrical and optical inputs and outputs (device under test—DUT), containing a contacting plate (probe substrate) and a redistribution plate (redistribution substrate). The contacting module constitutes an interface between a test apparatus (automated test equipment—ATE) and the DUT and is designed with electrical contacts (electrical probes), optical contacts (optical probes), optical elements and combinations thereof to conduct signals from the DUT and to the DUT and redistribute these signals for an interface to the test apparatus.

The separation into a contacting plate and a redistribution plate results in a modular design of the contacting module, which has the advantage that if the electrical contacts are damaged, the contacting plate can be replaced, while the redistribution plate can continue to be used with the comparatively expensive electrical and optical distribution network.

With regard to the optical inputs and outputs (optical interfaces), it is disclosed that these are created via optical elements located on the contacting plate and/or the redistribution plate and matched to various coupling mechanisms, e.g. free radiation, quasi-free radiation or waveguides. Suitable optical elements mentioned include diffractive elements and refractive elements. It is also stated that a photodetector or a light source may be located directly at the interface to the DUT and then constitute the optical input or output on the contacting plate.

According to an exemplary embodiment of the aforementioned US 2006/0109015 A1, the optical and electrical signal lines (optical and electrical distribution network) are embodied on separate redistribution plates. It is proposed to guide the electrical signals from the DUT to the edge regions of the contacting plate so that, in the first redistribution plate above the contacting plate, the electrical signals are coupled in above the edge region. This allows an opening to be formed in the first redistribution plate, in which only the electrical signals are redistributed, through which opening the optical signals are guided into a separate second redistribution plate above the first redistribution plate.

In summary, the aforementioned US 2006/0109015 A1 presents a multitude of ideas on how a contacting module, which is divided into a contacting plate and a redistribution plate for a reason, e.g. due to wear of the mechanical contacts for electrical signal transmission, could be additionally equipped with optical signal lines. This ignores the fact that the tolerances possible for the mechanical contact of the electrical inputs and outputs of the contacting module to the DUT cannot be transferred to the optical inputs and outputs.

While the transmission of a constant electrical signal via electrical interfaces requires the mechanical contact of needles present on the contacting module with contact plates (contact pads) present on the DUT, which can be ensured within a comparatively large position tolerance of a few μm in all three spatial directions, the quality of the optical signal transmission is already influenced by a much smaller deviation, in the submicron range, from its target position.

A contacting module that is insensitive to position tolerances of the optical interfaces is known from WO 2019/029765 A1. Similar to a contacting module according to the invention and to contacting modules known from the prior art, a contacting module as described therein is arranged between a wafer platform, e.g. a wafer prober, on which a wafer with optoelectronic chips under test is fixed, and a test apparatus for generating and evaluating optical signals and electrical signals. The contacting module establishes the signal-related connection between the individual optical and electrical interfaces of an optoelectronic chip under test and the specified device-related optical and electrical interfaces of the test apparatus. The interfaces are, respectively, electrical or optical inputs and outputs from or to which the electrical or optical signals are input or output, respectively, and are respectively transmitted to or from the optoelectronic chip under test, via electrical or optical signal lines.

The electrical interfaces on the contacting module 1 are each formed by the tips of contacting needles which, for transmitting the electrical signals, are each in mechanical contact with one electrical interface of the optoelectronic chip under test, each of which are formed by an electrical contact pad. As explained in detail in the description of the prior art, the tolerance limits required for reliable electrical contacting are large compared to the tolerances required for optical contacting.

It is also known from the aforementioned WO 2019/029765 A1 that the contacting module includes an electronic module on which the electrical interfaces are arranged and an optical module on which the optical interfaces are arranged. The optical module is attached to the electronic module in a defined manner via mechanical interfaces, whereby the arrangement of electrical interfaces has a defined relative position to the arrangement of optical interfaces.

The advantage compared to a monolithic contacting module is in particular that the electrical signal lines and the optical signal lines can be manufactured independently of each other by different manufacturing processes and also in or on substrates made of different materials. To ensure that all interfaces, whether optical or electrical, form a common arrangement that can be adjusted relative to the optoelectronic chip under test, the optical block is fixed in a manner adjusted to the electronic block.

In an advantageous embodiment of the contacting module, the optical block is advantageously embodied in its dimension and geometry, including breakthroughs and/or openings, in such a way that all contacting needles present on the electronic module can be in contact with the chip 2 past the optical block, around it and/or if necessary through openings formed therein. This enables the integration of all optical interfaces in one monolithic optical block.

In one embodiment example of a contacting module described in the aforementioned WO 2019/029765 A1, the electronic module corresponds in its technical design to a conventional contacting module for purely electronic chips. It contains a printed circuit board, an arrangement of contacting needles, embodied here, by way of example, as cantilever needles, and a carrier plate on which the mechanical interfaces to the test apparatus are located. The electrical contact is established via the electronic module by physical contact of the contacting needles with the electrical contact pads of the chip.

The optical module consists of an optical block with optical signal lines, each in the form of waveguides and an integrated mirror arranged in front of each waveguide, a fiber holder with V-grooves, as well as glass fibers and single fiber connectors or a multi-fiber connector. The waveguides are manufactured by a direct laser writing process and the mirrors are manufactured by a laser assisted etching process. Consequently, the waveguides are formed as a result of the input of laser energy by localized modified substrate material, which is characterized in particular by a local refractive index modification compared to the refractive index of the substrate material. The mirrors are formed by interfaces of etched recesses in the substrate material. The substrate material of the optical block is glass, preferably borofloat glass, and has a thickness in the range of several 100 µm to several millimeters, preferably 0.5-1 mm. The optical contacting takes place without direct contact with the chip over a distance between the chip and the contacting module. The process used to manufacture the mirrors and the waveguides enables the optical interfaces in particular to be manufactured with high precision relative to each other and to a mechanical interface on the optical block. Furthermore, free positioning of the mirrors and the waveguides within the substrate material is possible.

Preferably, the optical module is connected to the electronic module by being glued to a carrier plate in the electronic module, e.g. via three fixing points. When manufacturing the electronic module, e.g. with cantilever needles as the contacting needles, the Z-height of the needles is usually referenced to the clamping points of contacting module with a fixed reference to the wafer platform. With a metal frame as the carrier plate, these reference points are located on the metal frame into which the fixing points for the optical module are integrated with high precision. Thus, the optical module can be mounted exactly plane-parallel and precisely in relation to the reference plane of the tips of the contacting needles by positionally accurate gluing to the fixing points in the Z-direction. Plane-parallel mounting of the optical module with respect to the electronic module also prevents the optical module from colliding with the chip in operation, during contacting, due to the small working distance. As an alternative to being fixed to the carrier plate, the optical block can also be attached directly to the printed circuit board.

The aforementioned WO 2019/029765 A1 only discloses and suggests connecting mechanical interfaces between the optical block and the electronic module indirectly via adhesive. No further details are given, which is why it is obvious that adhesive is inserted here between planar mechanical interfaces.

SUMMARY OF THE INVENTION

It is an object of the invention to provide a contacting module with a new, cost-effective design of the mechanical interfaces between the optical block and the electronic module, or between the optical block and a mounting plate connected to the electronic block, with which the optical block can be freely positioned in all 6 degrees of freedom with respect to the electronic module in an adjustment position and then permanently fixed exactly in this adjustment position.

It is also an object of the invention to provide a method for mounting an optical block adjustable in all 6 degrees of freedom to an electronic module or to a mounting plate connected to the electronic block, by which the optical block can be fixed in an adjusted position with high precision and simplicity.

With respect to a contacting module, the object is achieved by a contacting module with an optical module, containing an optical block made of glass, which has an arrangement of optical interfaces in an optical interface plane, and an electronic module, containing a carrier plate, a printed circuit board and a needle carrier with an arrangement of contacting needles with needle tips, which form an arrangement of electrical interfaces in an electrical interface plane, the optical module and the electronic module being arranged relative to one another in such a way that the arrangement of optical interfaces and the arrangement of electrical interfaces have a defined adjustment position relative to one another with respect to all six degrees of freedom of a Cartesian coordinate system. It is essential to the invention that, according to a first alternative, the optical block is permanently connected to the carrier plate via at least three cylindrical pins or, according to a second alternative, the optical module has a mounting plate to which the optical block is permanently connected via at least three cylindrical pins. The cylindrical pins each contact the optical block with a first end face via adhesive. In the carrier plate or in the mounting plate, there are through holes arranged parallel to each other, in which the cylindrical pins are each connected to the carrier plate or the mounting plate via adhesive.

Advantageous embodiments are provided in subclaims 2 to 6 which include backreferences.

With respect to a method, the object is achieved by a method for mounting a contacting module with an optical module, containing an optical block made of glass, which has an arrangement of optical interfaces in an optical interface plane, and an electronic module, containing a carrier plate, a printed circuit board and a needle carrier with an arrangement of contacting needles with needle tips, which form an arrangement of electrical interfaces in an electrical interface plane, the optical module and the electronic module being arranged relative to one another in such a way that the arrangement of optical interfaces and the arrangement of electrical interfaces have a defined adjustment position relative to one another.

According to a first alternative, the arrangement of optical interfaces is first adjusted to the arrangement of electrical interfaces and then the optical block is permanently connected to the carrier plate via an adhesive connection according to the invention.

According to a second alternative, first the mounting plate contained in the optical module is connected to the carrier plate via a detachable connection in a relative position that can be produced repeatedly, then the arrangement of optical interfaces is adjusted to the arrangement of electrical interfaces, and then the optical block is permanently connected to the mounting plate via an adhesive connection according to the invention.

It is essential to the invention that the adhesive connection for both of the above alternatives is produced by making at least three through holes parallel to each other in the carrier plate or the mounting plate and inserting each of the at least three cylindrical pins through a respective one of the through holes until they come into contact with the optical block. Adhesive is first applied to a first end face of the cylindrical pins facing the optical block so that they bond to the optical block. The cylindrical pins are bonded to the carrier plate or the mounting plate either during or after passing through the through holes.

BRIEF DESCRIPTION OF THE DRAWINGS

The invention will be explained in more detail below with reference to exemplary embodiments and drawings. In the drawings.

DETAILED DESCRIPTION OF THE DRAWINGS

Figure 4A:
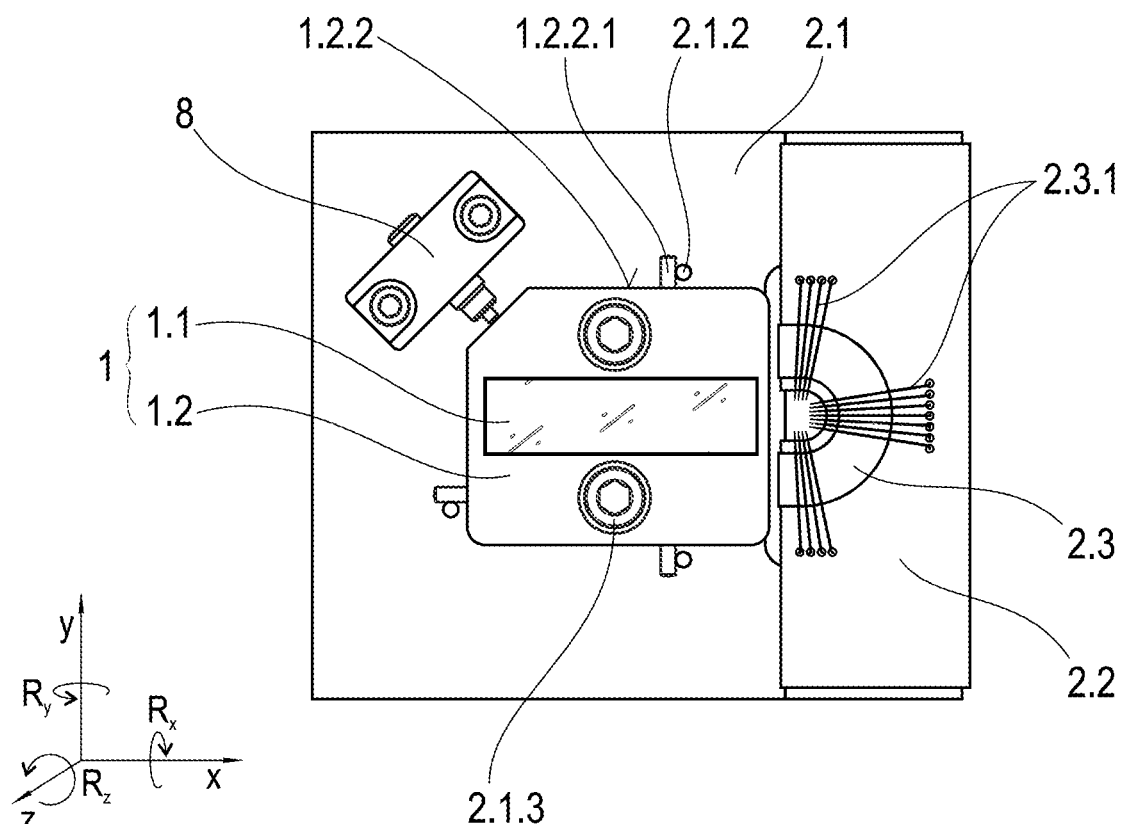
Figure 4B:
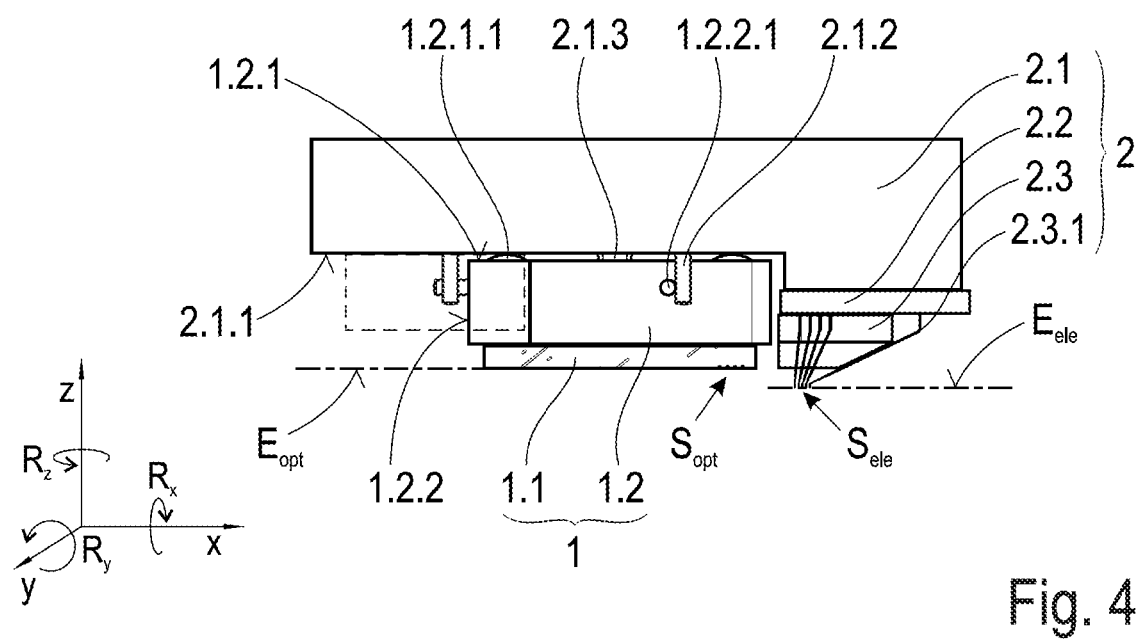

FIGS. 4a and 4b show a contacting module according to the second alternative with a first embodiment of the detachable connection.

Figure 1A:
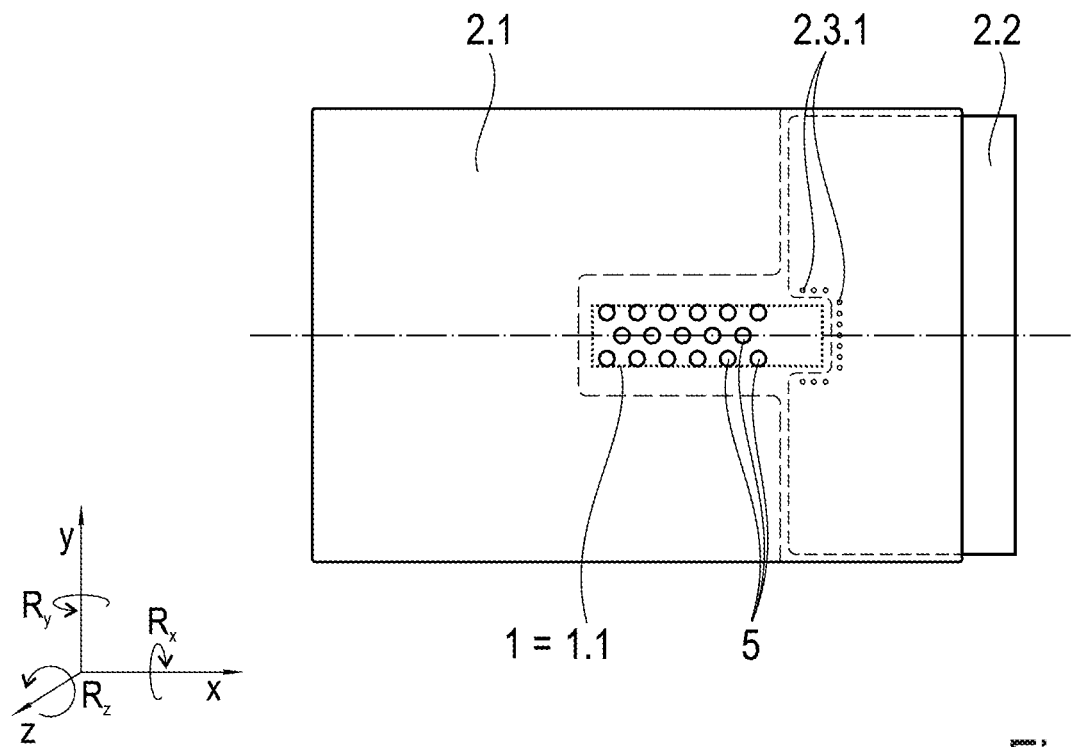
FIGS. 1a and 1b show a contacting module according to a first alternative in which the optical block of the optical module is connected to the carrier plate of the electronic module via an adhesive connection, in a top view and a sectional view.
Figure 1B:
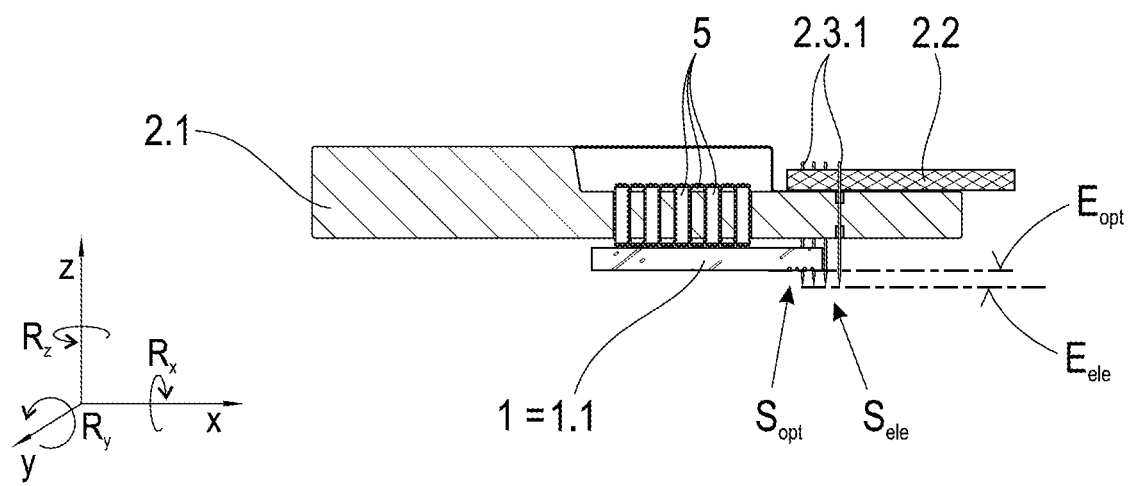

A contacting module according to the invention, as shown in FIGS. 1a and 1b, has an optical module 1, containing an optical block 1.1 made of glass, which has an arrangement of optical interfaces $S_{opt}$ in an optical interface plane $E_{opt}$, and an electronic module 2, containing a carrier plate 2.1, a printed circuit board 2.2 and a needle carrier 2.3 with an arrangement of contacting needles 2.3.1 with needle tips, which form an arrangement of electrical interfaces $S_{ele}$ in an electrical interface plane $E_{ele}$. The carrier plate 2.1 and the needle carrier 2.3 are firmly connected to each other or form a monolithic unit. The optical module 1 and the electronic module 2 are arranged relative to one another in such a way that the arrangement of optical interfaces $S_{opt}$ and the arrangement of electrical interfaces $S_{ele}$ have a defined adjustment position relative to one another with respect to all six degrees of freedom of a Cartesian coordinate system. The optical block 1.1 is fixed in an adjustment position via an adhesive connection. According to a first alternative for a contacting module according to the invention, the adjustment layer can be fixed directly between the optical block 1.1 and the electronic module 2, for which the carrier plate 2.1 forms the mechanical basis, by means of an adhesive connection according to the invention, see FIGS. 1a and 1b, or, according to a second alternative, it can be fixed indirectly between the optical block 1.1 and a mounting plate 1.2, possibly encompassed by the optical module 1, via an adhesive connection according to the invention, which is connected to the electronic module 2, more precisely to the carrier plate 2.1, via a reproducible, detachable connection, see FIGS. 2a and 2b.

Figure 3A:
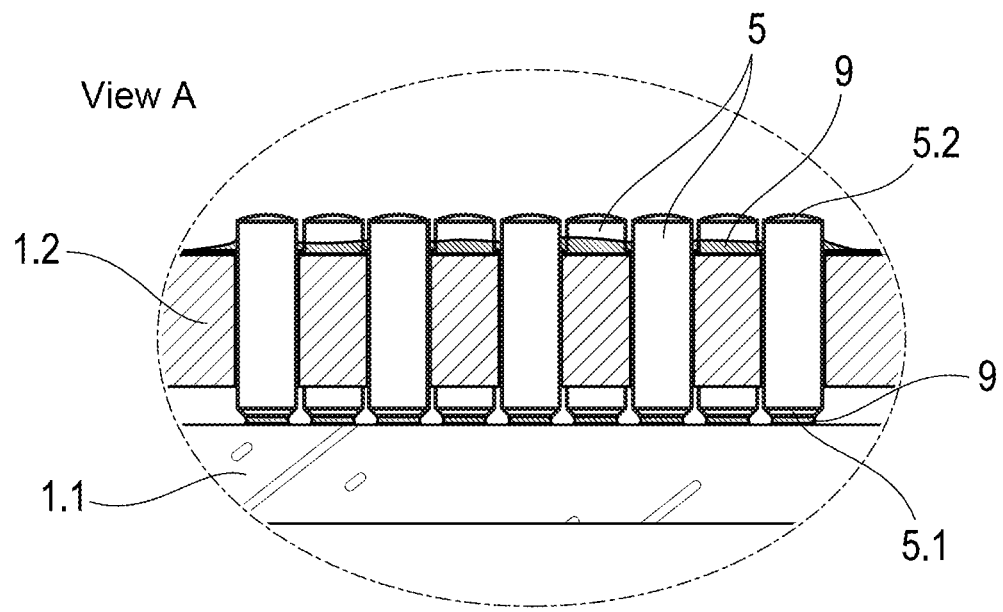
FIG. 3a shows a first embodiment of an adhesive connection according to the invention.

It is essential to the invention that the adhesive connection between the optical block 1.1 and the mounting plate 1.2 or the optical block 1.1 and the carrier plate 2.1 is made indirectly via at least three cylindrical pins 5. As can be seen more clearly in FIGS. 3a and 3b, the cylindrical pins 5 each have a first end face 5.1 in contact with the optical block 1.1 via adhesive 9. In the carrier plate 2.1 or in the mounting plate 1.2, there are through holes 7, in which the cylindrical pins 5 are each fixed to the carrier plate 2.1 or the mounting plate 1.2, respectively, via adhesive 9.

In one embodiment, the cylindrical pins 5 and the through holes 7 are dimensioned to match each other in such a way that a respective second end face 5.2 projects beyond the through holes 7, whereby the latter can be held in place during assembly until they come to rest against the optical block 1.1. In this case, the adhesive 9 is applied to the respective projecting circumferential surface of the cylindrical pins 5, see FIG. 3a.

Figure 3B:
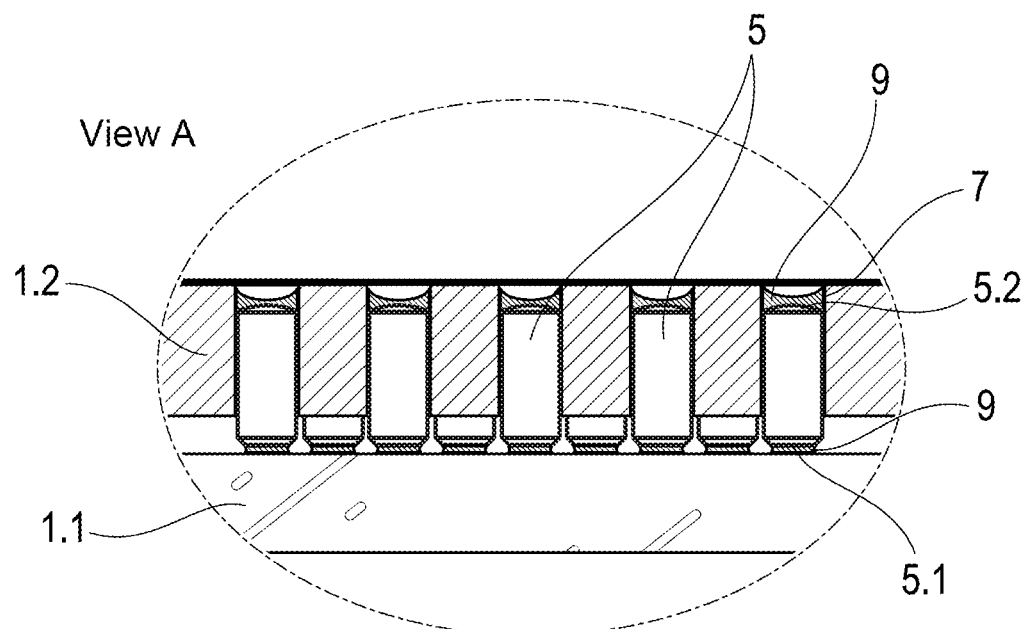
FIG. 3b shows a second embodiment of an adhesive connection according to the invention.

In another embodiment, shown in FIG. 3b, the second end face 5.2 of each of the cylindrical pins 5 is located internally in one of the through holes 7, and any free volume remaining above it in the through hole 7 is filled with adhesive 9.

In the case in which the optical block 1.1 is bonded to a mounting plate 1.2 according to the invention, the mounting plate 1.2 is advantageously connected to the carrier plate 2.1 via a repeatedly detachable connection, said detachable connection ensuring repeated production of the adjustment position of the arrangement of the optical interfaces $S_{opt}$ with respect to the arrangement of the electrical interfaces $S_{ele}$.

A first embodiment of the detachable connection is shown in FIGS. 4a and 4b, although an adhesive connection according to the invention is not shown here. On one end face 1.2.1 of the mounting plate, three elevations 1.2.1.1 defining a mounting plane are present here, which rest against a mounting surface 2.1.1 of the carrier plate 2.1, whereby the relative position of the mounting plate 1.2 in a z-direction, about an x-direction and about a y-direction of a Cartesian coordinate system with respect to the carrier plate 2.1 is fixed. There are three dowel pins 2.1.2 on the circumference of the mounting plate 1.2.2, which are aligned parallel to the mounting plane. Two of these are aligned perpendicular to each other and each rest against a respective stop pin 1.2.2.1 provided on the carrier plate 2.1. This determines the relative position of the mounting plate 1.2 in the x-direction and in the y-direction to the carrier plate 2.1. The third of the dowel pins 2.1.2 rests against a further stop pin 1.2.2.1 present on the carrier plate 2.1, thus fixing the relative position of the mounting plate 1.2 around the z-direction to the carrier plate 2.1. Even if the mounting plate 1.2 is repeatedly mounted on the carrier plate 2.1, the mounting plate 1.2 assumes the same relative position to the carrier plate 2.1. To place the stop pins 1.2.2.1 against the dowel pins 2.1.2, a contact pressure unit 8 can be temporarily placed on the carrier plate 2.1, for example. To fix the relative position, the mounting plate 1.2 is connected to the carrier plate 2.1 via at least one screw connection 2.1.3.

Figure 2A:
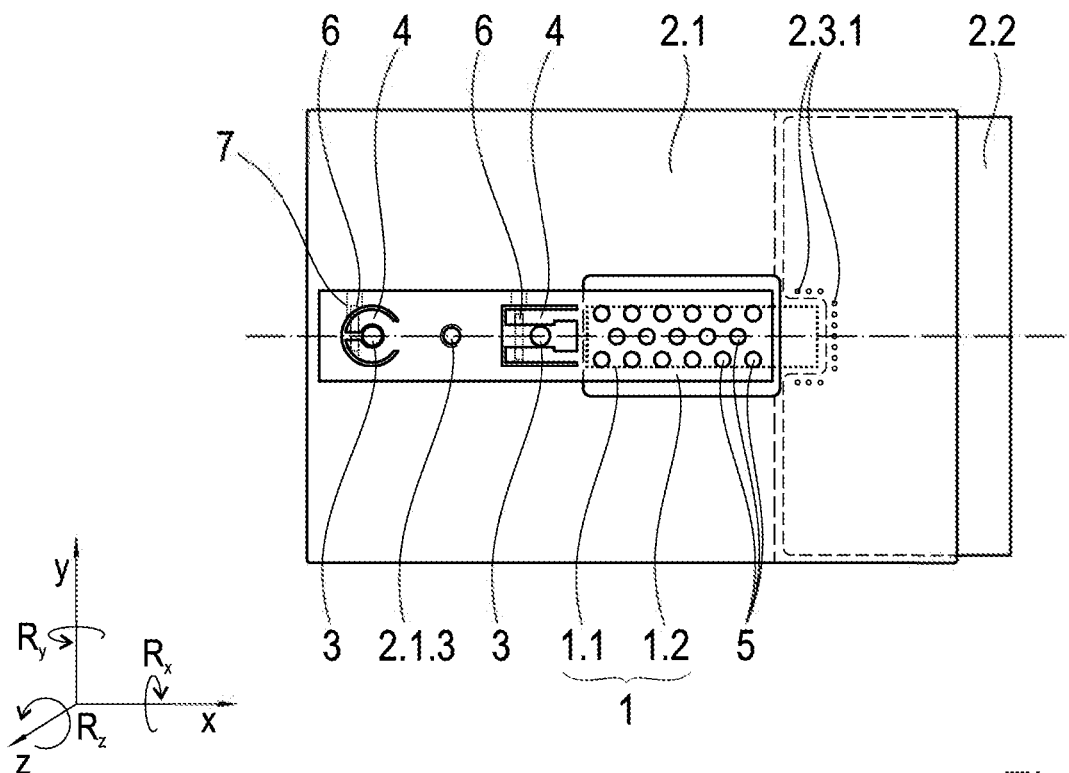
FIGS. 2a and 2b show a contacting module according to a second alternative in which the optical block is connected to a mounting plate of the optical module via an adhesive connection, in a top view and a sectional view.
Figure 2B:
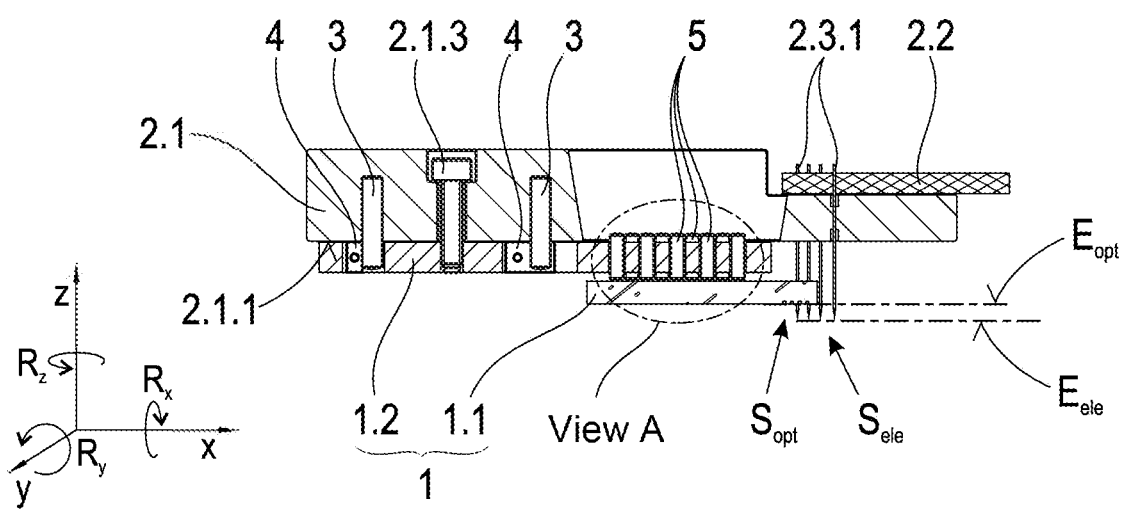

A second embodiment of the detachable connection is shown in FIGS. 2a and 2b.

Here, too, the relative position of the mounting plate 1.2 in the x-, in the y- and around the z-direction to the carrier plate 2.1 is determined by a three-point support, analogous to the first embodiment. In contrast to the first embodiment, the mounting plate 1.2 has two bending structures 4 penetrating the mounting plate 1.2 and formed, for example, by electroerosion. Two clamping pins 3 are provided on the carrier plate 2.1, aligned perpendicular to the mounting surface 2.1.1, firmly connected to the carrier plate 2.1. They can be connected directly or indirectly to the carrier plate, e.g. at the needle carrier 2.3, which is advantageously made of ceramic. For detachable connection of the mounting plate 1.2 to the carrier plate 2.1, the two clamping pins 3 are each clamped in one of the bending structures 4. In the first of the two bending structures 4, the first of the two clamping pins 3 is clamped circumferentially over its lateral surface, thus fixing the relative position of the mounting plate 1.2 in the x-direction and the y-direction to the carrier plate 2.1. Advantageously, the first of the two bending structures 4 has the shape of a pipe clamp. In the second of the two bending structures 4, the second of the two clamping pins 3 is clamped tangentially via its lateral surface, thus fixing the relative position of the mounting plate 1.2 around the z-direction to the carrier plate 2.1. To clamp the bending structures 4 on one of the clamping pins 3 in each case, the latter can be dimensioned in such a way that, in the stress-free state, they have an opening that is smaller than the cross-section of the clamping pins 3, so that they are clamped before or with the insertion of the clamping pins 3 and clamp the clamping pin 3.

Advantageously, the bending structures 4 are dimensioned so that they each have an opening that is larger than the cross-section of the clamping pins 3. Only after the clamping pins 3 have been inserted are the bending structures 4 tensioned to clamp the clamping pins 3. This can advantageously be done via a set screw 6, as shown.

Advantageously, to secure the fixed relative position, the mounting plate 1.2 is connected to the carrier plate 2.1 via at least one screw connection 2.1.3.

A method according to the invention for assembling a contacting module according to the invention will be explained in more detail below. As in the prior art, at the end of the adjustment and assembly the optical module 1 and the electronic module 2 are arranged relative to one another in such a way that the arrangement of optical interfaces $S_{opt}$ and the arrangement of electrical interfaces $S_{ele}$ have a defined adjustment position relative to one another in all six degrees of freedom.

A method according to the invention is used to assemble a contacting module comprising an optical module 1 and an electronic module 2. The optical module 1 includes an optical block 1.1 made of glass, which has an arrangement of optical interfaces $S_{opt}$ in an optical interface plane $E_{opt}$. The electronic module 2 contains a carrier plate 2.1, a printed circuit board 2.2 and a needle carrier 2.3 with an arrangement of contacting needles 2.3.1 with needle tips, which form an arrangement of electrical interfaces $S_{ele}$ in an electrical interface plane $E_{ele}$. The optical module 1 and the electronic module 2 are arranged relative to one another in such a way that the arrangement of optical interfaces $S_{opt}$ and the arrangement of electrical interfaces $S_{ele}$ have a defined adjustment position relative to one another.

The method can be used alternatively, either in a first alternative to the assembly of a contacting module described above, in which the optical module 1 is fixedly connected to the electronic module 2 via an adhesive connection, or in a second alternative to the assembly of a contacting module described above, in which the optical module 1 is repeatedly detachably connected to the electronic module 2. In the case of the second alternative, the optical module 1 additionally includes a mounting plate 1.2. On the mounting plate 1.2, the optical block 1.1 is arranged firmly connected to it via an adhesive connection, and the mounting plate 1.2, and thus the optical module 1, is detachably connected to the electronic module 2.

In the case of the first alternative, the arrangement of optical interfaces $S_{opt}$ is adjusted to the arrangement of electrical interfaces $S_{ele}$ and then the optical block 1.1 is permanently connected to the carrier plate 2.1 via an adhesive connection.

In the case of the second alternative, the mounting plate 1.2 of the optical module 1 is first connected to the carrier plate 2.1 of the electronic module 2 via a detachable connection in a relative position that can be repeatedly established. Subsequently, the arrangement of optical interfaces $S_{opt}$ is adjusted to the arrangement of electrical interfaces $S_{ele}$ and then the optical block 1.1 is permanently connected to the mounting plate 1.2 via an adhesive connection.

The embodiment of the adhesive connection is essential to the invention.

In order to produce an adhesive connection in accordance with the invention, at least three through holes 7 parallel to each other are previously made in the carrier plate 2.1 or the mounting plate 1.2. In the case of exactly three through holes 7, these are arranged forming a triangle with respect to each other. The through holes 7 are used to later accommodate cylindrical pins 5 via which the adhesive connection is made as an indirect adhesive connection.

Before the adhesive connection is made between the optical block 1.1 and the carrier plate 2.1 or the mounting plate 1.2, the optical block 1.1 is aligned so that the arrangement of optical interfaces $S_{opt}$ is adjusted with respect to the arrangement of electrical interfaces $S_{ele}$. This creates a relative position of the optical block 1.1 to the carrier plate 2.1 or the mounting plate 1.2, which is fixed in all 6 degrees of freedom by the adhesive connection.

At least three cylindrical pins 5 are each guided through one of the through holes 7 until they each come into contact with the optical block 1.1, adhesive 9 having previously been applied to a first end face 5.1 of the cylindrical pins 5 facing the optical block 1.1 in each case, thereby bonding the cylindrical pins 5 to the optical block 1.1. The cylindrical pins 5 are bonded to the carrier plate 2.1 or to the mounting plate 1.2 either during or after passing through the through holes 7.

In order to bond the cylindrical pins 5 when they are guided through the through holes 7, adhesive 9 is previously applied either to their circumferential surface, facing the second end face 5.2, or into the through holes 7.

A defined bonding surface for the cylindrical pins 5 is obtained by advantageously dimensioning the cylindrical pins 5 and the through holes 7 so that the second end face 5.1 lies within the through hole 7. The remaining free volume in the through hole 7 is then filled with adhesive 9.

If the optical block 1.1 and the carrier plate 2.1 or the mounting plate 1.2 are aligned parallel to each other in the adjusted relative position, all cylindrical pins 5 are glued equally deep in the through holes 7. This does not change for relative positions which differ in the x-direction, in the y-direction, in the z-direction or around the z-direction. A tilt around the x-direction or around the y-direction is compensated by placing the cylindrical pins 5 more or less deep in the through holes arranged on the optical block. Unlike many adhesive connections known from the prior art, tilting does not have to be compensated for by the amount of adhesive 9. An equal amount of adhesive at all points where the connection is formed has the advantage that the behavior of the adhesive 9, e.g. shrinkage during solidification, is the same everywhere, thus fixing the adjusted relative position with high precision.

LIST OF REFERENCE NUMERALS 1 optical module
1.1 optical block
1.2 mounting plate
1.2.1 end face of the mounting plate
1.2.1.1 elevation
1.2.2 circumference of the mounting plate
1.2.2.1 stop pin
2 electronic module
2.1 carrier plate
2.1.1 mounting surface
2.1.2 dowel pin
2.2 printed circuit board
2.3 needle carrier
2.3.1 contacting needle
3 clamping pin
4 bending structure
5 cylindrical pin
5.1 first end face of the cylindrical pin
5.2 second end face of the cylindrical pin
6 set screw
7 through hole
8 contact pressure unit
9 adhesive
$S_{opt}$ optical interface
$S_{ele}$ electrical interface
$E_{opt}$ optical interface plane (of the contacting module)
$E_{ele}$ electrical interface plane (of the contacting module)

The invention claimed is:

1. A contacting module, comprising:
an optical module including an optical block made of glass, which has an arrangement of optical interfaces ($S_{opt}$) in an optical interface plane ($E_{opt}$), and
an electronic module, containing a carrier plate, a printed circuit board and a needle carrier with an arrangement of contacting needles with needle tips, which form an arrangement of electrical interfaces ($S_{ele}$) in an electrical interface plane ($E_{ele}$),
wherein the optical module and the electronic module are arranged relative to one another in such a way that the arrangement of optical interfaces ($S_{opt}$) and the arrangement of electrical interfaces ($S_{ele}$) have a defined adjustment position relative to one another with respect to all six degrees of freedom of a Cartesian coordinate system, and
wherein the optical block is permanently connected to the carrier plate via at least three cylindrical pins, or the optical module has a mounting plate to which the optical block is permanently connected via at least three cylindrical pins, wherein the cylindrical pins each contact the optical block with a first end face of the cylindrical pin via adhesive, and in the carrier plate or in the mounting plate, there are through holes arranged parallel to each other, in which the cylindrical pins are each connected to the carrier plate or the mounting plate via adhesive.

2. The contacting module according to claim 1, wherein a second end face of the cylindrical pins is located internally in one of the through holes, and any free volume remaining above the second end face in the through hole is filled with adhesive.

3. The contacting module according to claim 1, wherein the mounting plate is connected to the carrier plate via a repeatedly detachable connection, said detachable connection ensuring repeated production of the adjustment position of the arrangement of the optical interfaces ($S_{opt}$) with respect to the arrangement of the electrical interfaces ($S_{ele}$).

4. The contacting module according to claim 3, wherein, on one end face of the mounting plate, three elevations defining a mounting plane are present, which rest against a mounting surface of the carrier plate, whereby a relative position of the mounting plate in a z-direction, about an x-direction and about a y-direction of a Cartesian coordinate system with respect to the carrier plate is fixed, and there are three dowel pins on a circumference of the mounting plate, which are aligned parallel to the mounting plane and two of which are aligned perpendicular to each other and each rest against a respective stop pin provided on the carrier plate, which determines the relative position of the mounting plate in the x-direction and in the y-direction to the carrier plate, and the third of the dowel pins rests against a further stop pin present on the carrier plate, thus fixing the relative position of the mounting plate around the z-direction to the carrier plate.

5. The contacting module according to claim 3, wherein on one end face of the mounting plate, three elevations defining a mounting plane are present, which rest against a mounting surface of the carrier plate, whereby a relative position of the mounting plate in a z-direction, about an x-direction and about a y-direction of a Cartesian coordinate system with respect to the carrier plate is fixed, and the mounting plate has two bending structures penetrating the mounting plate, wherein in the first of the two bending structures, a first clamping pin attached to the carrier plate is clamped circumferentially over its lateral surface, thus fixing the relative position of the mounting plate in the x-direction and the y-direction to the carrier plate, and in the second of the bending structures, a second clamping pin attached to the carrier plate is clamped tangentially via its lateral surface, thus fixing the relative position of the mounting plate around the z-direction to the carrier plate.

6. The contacting module according to claim 5, wherein the first bending structure has the shape of a pipe clamp, in which the first clamping pin is clamped in a self-centered manner.

7. A method for assembly of a contacting module with an optical module, containing an optical block made of glass, which has an arrangement of optical interfaces ($S_{opt}$) in an optical interface plane ($E_{opt}$), and an electronic module, containing a carrier plate, a printed circuit board and a needle carrier with an arrangement of contacting needles with needle tips, which form an arrangement of electrical interfaces ($S_{ele}$) in an electrical interface plane ($E_{ele}$), the optical module and the electronic module being arranged relative to one another in such a way that the arrangement of optical interfaces and the arrangement of electrical interfaces have a defined adjustment position relative to one another, comprising:

first adjusting either the arrangement of optical interfaces ($S_{opt}$) to the arrangement of electrical interfaces ($S_{ele}$) and then permanently connecting the optical block to the carrier plate via an adhesive connection, or first connecting a mounting plate to the carrier plate via a detachable connection in a relative position that can be repeatedly established, subsequently adjusting the arrangement of optical interfaces ($S_{opt}$) to the arrangement of electrical interfaces ($S_{ele}$) and then permanently connecting the optical block to the carrier plate via an adhesive connection, wherein the adhesive connection for both of the above alternatives is produced by making at least three through holes parallel to each other in the carrier plate or the mounting plate, and guiding at least three cylindrical pins through one of the through holes until they each come into contact with the optical block, adhesive having previously been applied to a first end face of the cylindrical pins which faces the optical block in each case, such that the cylindrical pins are bonded either during or after guiding them through the through holes.

* * * * *